United States Patent
Novak et al.

(10) Patent No.: US 7,049,832 B2
(45) Date of Patent: May 23, 2006

(54) CIRCUIT ARRANGEMENT AND METHOD FOR DETERMINING THE LOAD CURRENT THROUGH AN INDUCTIVE LOAD CONNECTED TO A SUPPLY VOLTAGE IN A CLOCKED MANNER

(75) Inventors: Heinz Novak, Graz (AT); Martin Allram, Graz (AT); Michael Hausmann, Graz (AT)

(73) Assignee: Infineon Technologies AG, Munich (DE)

( * ) Notice: Subject to any disclaimer, the term of this patent is extended or adjusted under 35 U.S.C. 154(b) by 2 days.

(21) Appl. No.: 11/055,942

(22) Filed: Feb. 11, 2005

(65) Prior Publication Data

US 2005/0179441 A1 Aug. 18, 2005

(30) Foreign Application Priority Data

Feb. 13, 2004 (DE) .................. 10 2004 007 209

(51) Int. Cl.
*G01R 27/08* (2006.01)
(52) U.S. Cl. ....................... 324/713; 324/654
(58) Field of Classification Search ................ 324/654
See application file for complete search history.

(56) References Cited

U.S. PATENT DOCUMENTS

2004/0044459 A1* 3/2004 Wakao et al. ................ 701/69

FOREIGN PATENT DOCUMENTS

| DE | 2422536 A1 * | 2/1976 |
| DE | 38 43 507 A1 | 6/1990 |
| DE | 199 15 593 A1 | 11/2000 |
| DE | 102 00 650 A1 | 5/2003 |

* cited by examiner

Primary Examiner—Vincent Q. Nguyen
(74) Attorney, Agent, or Firm—Maginot Moore & Beck

(57) ABSTRACT

Circuit arrangement for determining the load current through an inductive load (L) connected to a supply voltage (Vbat) in a clocked manner includes a current measuring impedance (30) which can be connected in series with the inductive load (L), a first and second connecting terminal (31, 32), a measuring amplifier (20) having a first and second input (21, 22) and an output (23), and a level shifter arrangement (40) having first and second inputs (41, 42) and first and second outputs (43, 44) The arrangement is designed to map a potential present at the first input terminal (41) onto a potential shifted by a predetermined potential value at the first output terminal (43) and to map a potential present at the second input terminal (42) onto a potential shifted by a predetermined potential value at the second output terminal (44). First and switching device (S1A, S2A, S1B, S2B) are designed to connect the first connecting terminal (31, 32) of the current measuring impedance (30) to the inputs(21, 22) of the measuring amplifier (20).

19 Claims, 4 Drawing Sheets

CIRCUIT ARRANGEMENT AND METHOD FOR DETERMINING THE LOAD CURRENT THROUGH AN INDUCTIVE LOAD CONNECTED TO A SUPPLY VOLTAGE IN A CLOCKED MANNER

BACKGROUND

The present invention relates to a circuit arrangement and a method for determining the load current through an inductive load connected to a supply voltage in a clocked manner.

There are a wide variety of applications in which inductive loads, such as, by way of example, electric motors or electrically actuable valves, are connected to a supply voltage in a clocked manner according to a pulse-width-modulated drive signal in order thereby to regulate the current consumption of the load. In the case of electric motors, by way of example, the rotational speed of the motors can be regulated by way of the duty ratio of the pulse width modulation and the current consumption dependent thereon. For suitable driving of the load, it is necessary in this case to detect the load current flowing through the load.

FIG. 1 shows an example of the interconnection of an inductive load L for pulse-width-modulated connection of the load to a supply voltage. The load L is connected in series with a switch S, which is driven according to a pulse-width-modulated signal PWM, between a terminal for supply potential Vbat and a terminal for reference-ground potential GND. In order to detect a load current flowing through the load L, provision is made of a current measuring impedance Z connected between the load L and the switch S. The switch S is connected between the load L and reference-ground potential GND; a freewheeling diode D is connected in parallel with the series circuit formed by inductive load L and measuring impedance Z.

In the case of the circuit arrangement illustrated, it is possible to tap off a voltage Vm across the measuring impedance Z, which, according to Ohm's law, is related to the current flowing through the load L by way of the value of the measuring impedance Z. In the case where switch S is closed, disregarding a voltage drop across the switch S, said voltage Vm is referred to reference-ground potential GND and can be evaluated by means of a simple differential amplifier (not illustrated). After the switch S has been opened, a current continues to flow through the measuring impedance Z, but now said current flows via the freewheeling diode D. The measurement voltage Vm is now referred, however, to a potential that lies above the supply potential Vbat by the value of the forward voltage of the diode D. Evaluation of such measurement voltages referred to a high potential necessitates special amplifiers, so-called rail-to-rail amplifiers, which are able to evaluate voltages that are referred to greatly fluctuating reference potentials. However, such amplifiers are complicated to realize and therefore cost-intensive, for which reason one has hitherto been restricted in many cases to detecting the current through the inductive load L only during the switch-on phase of the switch S.

It is an aim of the present invention to provide a circuit arrangement and a method for determining the load current through an inductive load connected to a supply voltage in a clocked manner which can be realized simply and cost-effectively and provide a measured current value both during the switch-on phases, in which the load is connected to the supply voltage, and during the switch-off phases.

SUMMARY

The circuit arrangement for determining the load current through an inductive load connected to a supply voltage in a clocked manner comprises a current measuring impedance, which can be connected in series with the inductive load and has a first and a second connecting terminal, and a measuring amplifier having a first and second input and an output. The circuit arrangement furthermore comprises a level shifter arrangement having first and second inputs and first and second outputs, which is designed to map a potential present at the first input terminal onto a potential shifted by a predetermined potential value at the first output terminal and to map a potential present at the second input terminal onto a potential shifted by a predetermined potential value at the second output terminal. The circuit arrangement furthermore comprises first switching means, which are designed to connect the first connecting terminal of the current measuring impedance to a first input of the measuring amplifier either directly or with interposition of the level shifter arrangement, and second switching means, which are designed to connect the second connecting terminal of the current measuring impedance to the second input of the measuring amplifier either directly or with interposition of the level shifter.

The present invention makes use of the fact that a measurement voltage that can be tapped off across the measuring impedance and is dependent on the current through the inductive load is referred to two different potentials, depending on whether the inductive load is connected to the supply voltage or whether the load is in freewheeling operation. In this case, a task of the level shifter, during one of these operating states, is to shift the potentials present at the connecting terminals of the measuring impedance in the same way in each case such that a voltage signal which is approximately referred to the same potential is fed to the measuring amplifier in both operating states. Consequently, a simple measuring amplifier, for example a differential amplifier, can be used for determining the load current during both operating states, which amplifier does not have to be designed to evaluate voltages with a greatly fluctuating DC voltage offset that are referred to greatly fluctuating potentials or have a greatly fluctuating DC voltage offset.

In the simplest case, the level shifter arrangement comprises two voltage sources that supply identical voltages and are in each case connected between the input terminals and the output terminals of the level shifter arrangement.

A further embodiment provides for the level shifter arrangement to have a first and second capacitive storage element and also third and fourth switching means. In this case, the third switching means are designed optionally to connect the first capacitive storage element to a supply voltage or to connect it between the first input terminal and the first output terminal, and the fourth switching means are designed optionally to connect the second capacitive storage element to the supply voltage or to connect it between the second input terminal and the second output terminal. In this embodiment, during the operating phase in which the connecting terminals of the measuring impedance are connected to the measuring amplifier with the level shifter arrangement being bypassed, the capacitive storage elements are connected to the supply voltage via the switching means in order to charge them. During the operating state in which the connecting terminals of the measuring impedance are connected to the inputs of the measuring amplifier with interposition of the level shifter arrangement, the charged capacitive storage elements are connected between the input terminals and output terminals of the level shifter arrangement in order to effect the above-explained potential shift between the potentials at the inputs and the outputs of the level shifter arrangement.

The supply voltage to which the capacitive storage elements in the level shifter arrangement are charged preferably corresponds to the supply voltage to which the inductive load whose load current is to be detected is connected in pulse-width-modulated fashion.

The present invention is explained in more detail below in exemplary embodiments with reference to figures.

BRIEF DESCRIPTION OF THE DRAWINGS

In the figures, unless specified otherwise, identical reference symbols designate identical circuit components and signals with the same meaning.

DESCRIPTION

Figure 1:
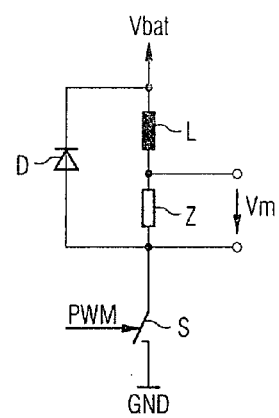
FIG. 1 shows a circuit arrangement having an inductive load that can be connected to a supply voltage in a clocked manner according to the prior art.
Figure 2:
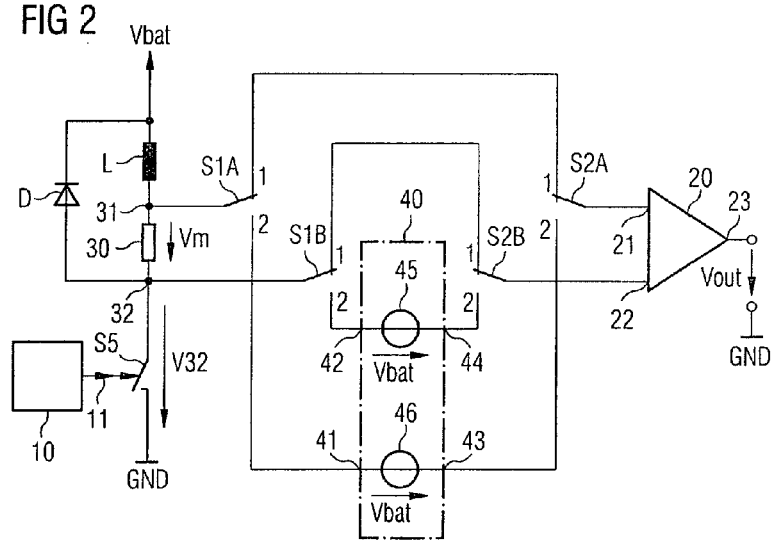
FIG. 2 shows a circuit arrangement having an inductive load that can be connected to a supply voltage in a clocked manner and having a circuit arrangement according to the invention for detecting a load current flowing through the inductive load in accordance with a first embodiment.

The circuit arrangement according to the invention—illustrated in FIG. 2—for detecting the load current through an inductive load L connected to a supply voltage Vbat in a clocked manner comprises a current measuring impedance 30 having a first and second connecting terminal 31, 32, which is connected in series with the inductive load L. In order to connect the inductive load L to the supply voltage Vbat, provision is made of a switch S5 driven in a pulse-width-modulated manner, which is connected between reference-ground potential GND and the series circuit comprising the load L and the measuring impedance 30. The switch S5 is connected as a low-side switch between the load L and the reference-ground potential GND. In order to drive the switch, provision is made of a pulse width modulator 10 that provides a pul-pulse-width-modulated signal 11. A freewheeling diode D is connected in parallel with the series circuit with the inductive load L and the measuring impedance 30, said diode accepting the load current induced through the inductive load L after the switch S5 has been opened.

The circuit arrangement for detecting the load current comprises a measuring amplifier 20 having input terminals 21, 22 for applying a voltage Vm present across the measuring impedance 30 and having an output terminal 23 for providing an amplified measurement voltage Vout with respect to reference-ground potential GND. The measuring circuit furthermore comprises a level shifter arrangement 40 having first and second input terminals 41, 42 and first and second output terminals 43, 44 and also switching means S1A, S2A, S1B, S2B, which are designed to connect the first and second connecting terminals 31, 32 of the measuring impedance 30 to the input terminals 21, 22 of the measuring amplifier 20 either directly or with interposition of the level shifter arrangement 40. The first switching means comprise a first changeover switch S1A, which connects the first measuring impedance terminal 31 either to the first input 41 of the level shifter 40 or to the first input 21 of the measuring amplifier 20, and a second changeover switch S2A, which connects the first input 21 of the measuring amplifier 20 either via the first changeover switch S1A to the first measuring impedance terminal 31 or to the first output 43 of the level shifter 40. The second switching means correspondingly comprise a third changeover switch S1B, which connects the second measuring impedance terminal 32 either via a fourth changeover switch S2B to the second input 22 of the measuring amplifier 20 or to the second input 42 of the level shifter. The fourth changeover switch connects the second input of the measuring amplifier 20 either via the third changeover switch S1B to the second measuring impedance terminal 32 or to the second output 44 of the level shifter 40.

It should be pointed out that the switching means, which are illustrated symbolically as simple changeover switches S1A-S2B in FIG. 2, can be realized in any desired manner, in particular as transistor circuits.

The level shifter illustrated in FIG. 2 comprises first and second voltage sources 45, 46, which are respectively connected between one of the inputs 41, 42 and one of the outputs 43, 44. The voltage sources 45, 46 ensure that a potential present at the input terminals 41, 42 is mapped onto a potential which is present at the output terminals and is shifted relative to the input potential value by the value of the voltage supplied by the voltage sources 45, 46. The value of the voltages supplied by said voltage sources 45, 46 preferably corresponds to the value of the supply voltage Vbat to which the inductive load L is connected in a clocked manner.

The functioning of the circuit arrangement illustrated in FIG. 2 is explained below.

In order to drive the inductive load L, the switch S5 is opened and closed in a clocked manner according to the pulse-width-modulated signal 11, hereafter the operating state in which the switch S5 is closed being designated as first operating state and the operating state in which the switch S5 is open being designated as second operating state. In the first operating state, assuming that the switch S5 has a negligible on resistance, the supply voltage Vbat is present across the the series circuit comprising inductive load L and measuring impedance 30. The second measuring impedance terminal 32 is thereby approximately at reference-ground potential GND, and the potential at the second measuring impedance terminal 31 lies above reference-ground potential GND by the value of the measurement voltage Vm present across the measuring impedance 30. During this first operating state, the measuring impedance terminals 31, 32 are connected via the switching means S1A, S1B, S2A, S2B directly to the inputs 21, 22 of the measuring amplifier 20. The numerals "1" beside the switching means S1A-S2B denote the switch position during this first operating state in order to afford better understanding. For amplifying said measurement voltage Vm, the measuring amplifier 20 may be designed as a simple measuring amplifier that is suitable for amplifying a measurement voltage Vm referred to reference-ground potential GND.

During the second operating state, when the switch S5 is open, the freewheeling diode D continues to enable a current flow between the connecting terminals of the inductive load L and thus across the measuring impedance 30, this current flow slowly decreasing over time according to the law of induction. The absolute value of the measurement voltage Vm across the measuring impedance 30, which rises over time when switch S5 is closed, and falls over time when the switch is open, is not influenced by the actual switching operation. However, after the switch S5 has been opened, the potential at the second measuring impedance terminal 32 rises to a value that approximately corresponds to the supply potential Vbat plus the forward voltage Vd of the freewheeling diode D. As a result, the measurement voltage Vm is no longer referred to reference-ground potential GND but rather to this higher potential Vbat+ Vd, where Vd designates the forward voltage of the freewheeling diode D.

In this second operating state of the load, the measuring impedance terminals 31, 32 are connected to the input terminals 21, 22 of the measuring amplifier 20 with interposition of the level shifter 40. The level shifter 40 ensures that, at the inputs 21, 22 of the measuring amplifier 20, potentials are present which are in each case shifted toward lower potentials by a value Vbat compared with the potentials at the measuring impedance terminals 31, 32. The potential at the second output terminal 44 of the level shifter 40 thus corresponds to the potential at the second measuring impedance terminal 32 minus the voltage Vbat inserted by the level shifter, and the potential at the first output terminal 43 of the level shifter 40 corresponds to the potential at the first measuring impedance terminal 31 minus the voltage Vbat inserted by the level shifter. The level shifter 40 only influences the DC voltage offset of the measurement voltage Vm relative to reference-ground potential GND, but not the value of the measurement voltage Vm which results from the difference between the potentials V31 and V32 at the first and second measuring impedance terminals 31, 32. Due to the level shifter 40, there is present between the first and second connecting terminals 21, 22 of the measuring amplifier 20 a voltage which corresponds to the measurement voltage Vm present between the measuring impedance terminals 31, 32 and has, relative to reference-ground potential GND, a DC voltage offset corresponding to the value of the forward voltage Vd of the freewheeling diode D.

The switching means S1A-S2B are driven for example according to the pulse-width-modulated signal in such a way that they assume the switch position "1" when switch S5 is closed and the switch position "2" when switch S5 is open.

Figure 5A:
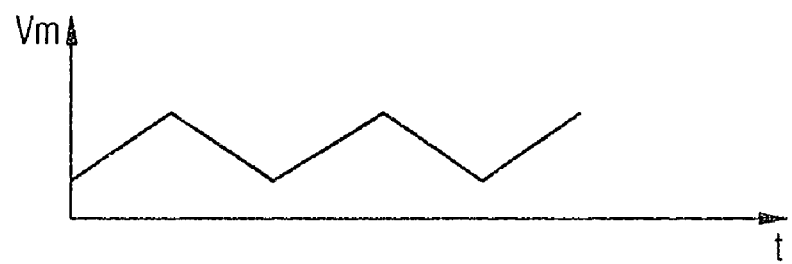
FIG. 5 shows temporal profiles of selected voltages/potentials depicted in FIGS. 2 and 3.
Figure 5B:
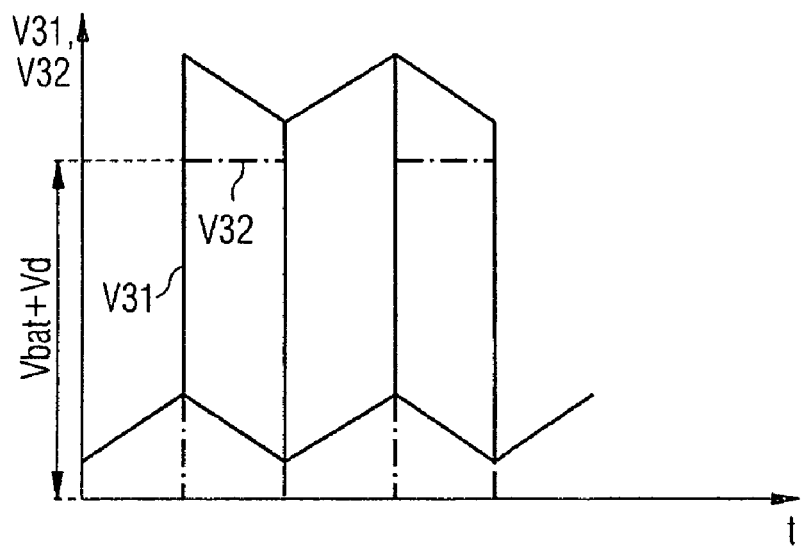
Figure 5C:
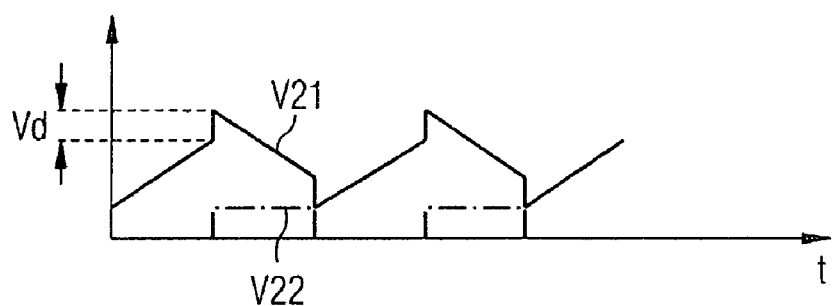
Figure 5D:
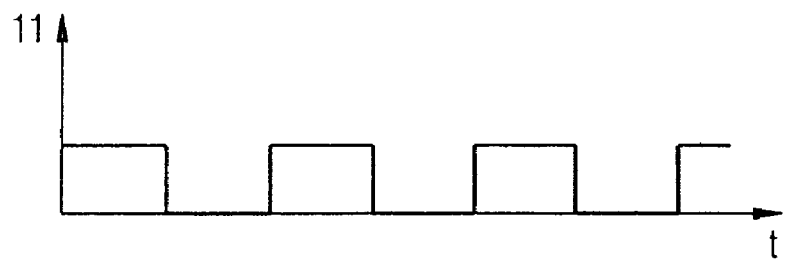

In order to afford better understanding of the interrelation explained above, FIG. 5 illustrates the temporal profile of the measurement voltage Vm, of the potentials V31, V32 at the first and second measuring impedance terminals 31, 32 with respect to reference-ground potential GND, and of the potentials V21, V22 at the measuring amplifier inputs 21, 22 as a function of the drive signal 11 of the switch S5. The changing reference potential for the voltage Vm, which is represented by the potential V32, is illustrated best on the basis of FIG. 5b, which shows the profile of the potentials V31, V32 at the measuring impedance terminals 31, 32. When switch S5 is closed, the measurement voltage Vm, which corresponds to the difference between the potentials V31, V32, is referred to the reference-ground potential GND of the circuit, the potential V32 corresponds to said reference-ground potential GND and the potential V31 corresponds to the measurement voltage Vm. When the switch is subsequently opened, the potential V32 to which the measurement voltage Vm is referred rises by a value Vbat plus Vd, the actual measurement voltage Vm not being influenced by the changeover operation. When the switch is closed, if the measurement voltage Vm is applied directly to the measuring amplifier, the potential V21 corresponds to the potential V31 and the potential V22 corresponds to the potential V32. Due to the level shifter 40, the potentials V21, V22 when the switch is closed are shifted toward lower values by the value Vbat compared with the potentials V31, V32, as a result of which the voltage present between the connecting terminals 31, 32 of the measuring amplifier 20 only has an offset of Vd relative to reference-ground potential GND. The DC voltage offset of the signal V20 present between the inputs 21, 22 of the measuring amplifier 20 relative to reference-ground potential thus fluctuates between zero and Vd. Even simple measuring amplifiers, such as differential amplifiers, by way of example, are able to provide from such input voltages an output voltage Vout whose value is dependent only on the input voltage difference and the offset is masked out.

Figure 3:
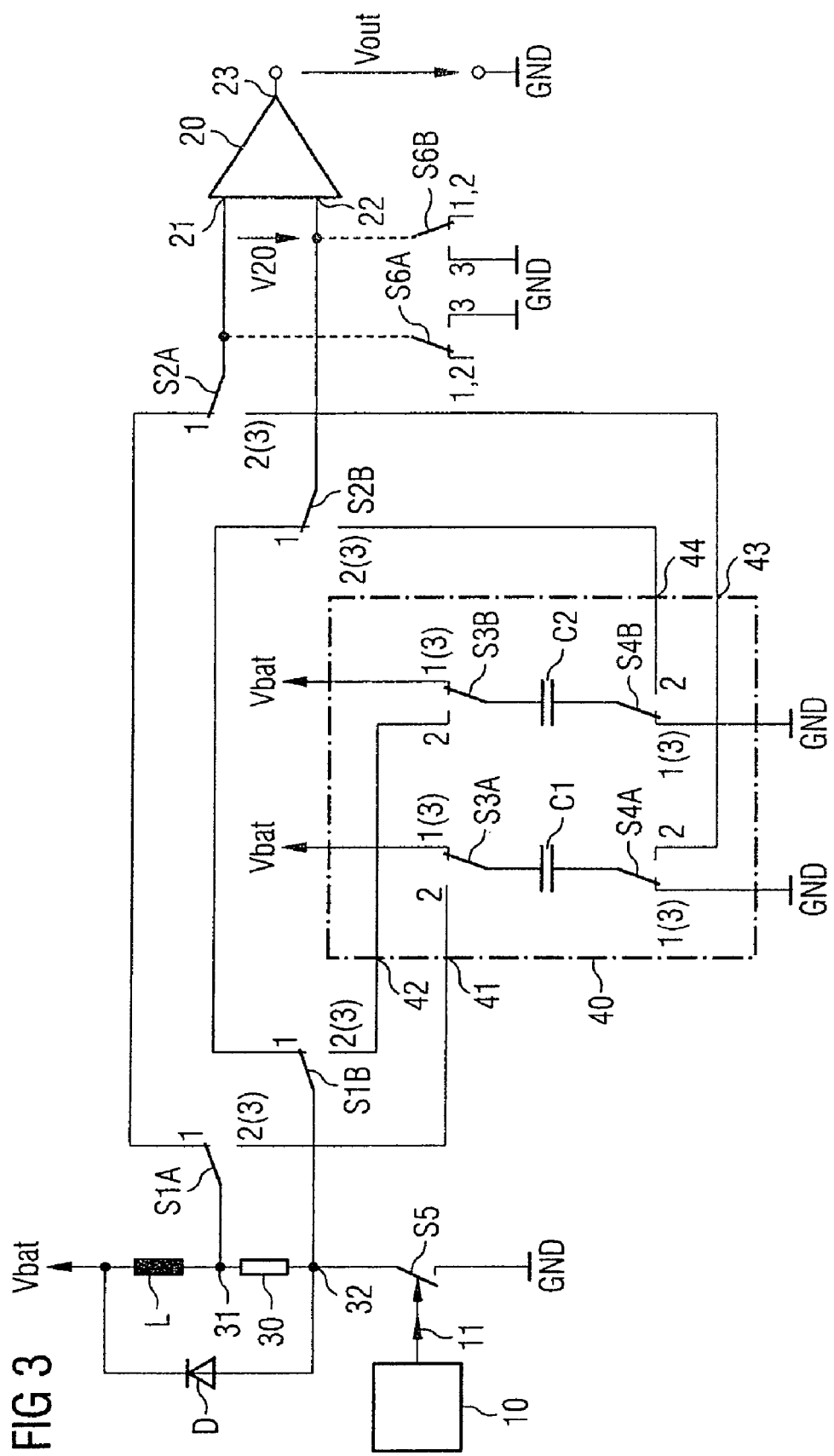
FIG. 3 shows a circuit arrangement having an inductive load that can be connected to a supply voltage in a clocked manner and having a circuit arrangement according to the invention for detecting a load current through the inductive load in accordance with a second embodiment.

FIG. 3 shows a second exemplary embodiment of the circuit arrangement according to the invention, in which the level shifter arrangement 40 has two capacitive storage elements C1, C2, which, by means of third and fourth switching means S3A, S4A and S3B, S4B, can optionally be connected to a supply voltage or be connected between the input and output terminals 41, 42 and 43, 44, respectively, of the level shifter arrangement.

During the first operating state, if the measuring impedance terminals 31, 32 are connected directly to the terminals 21, 22 of the measuring amplifier 20 via the first and second switching means, the storage elements C1, C2, which are designed as capacitors in the example, are connected to the supply voltage Vbat. For this purpose, the third and fourth switching means in each case comprise two changeover switches, in each case a first changeover switch S3A, S3B being connected between the respective capacitor C1, C2 and a terminal for supply potential, and a second changeover switch S4A, S4B being connected between the respective capacitor C1, C2 and a terminal for reference-ground potential GND. During the second operating state, the first changeover switches S3A, S3B connect the capacitors C1, C2 that have previously been charged to the supply voltage Vbat to the first and second input terminals 41, 42 of the level shifter 40, and the second changeover switches S4A, S4B connect the capacitors C1, C2 to the first and second output terminals 43, 44 of the level shifter 40.

Figure 4A:
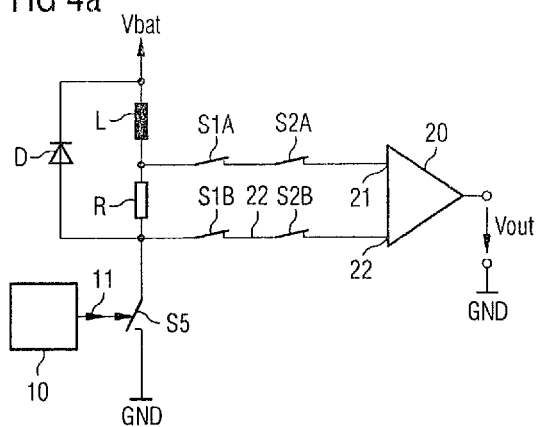
FIG. 4 illustrates the functioning of the circuit arrangement illustrated in FIG. 3 for two different operating states of the inductive load.
Figure 4B:
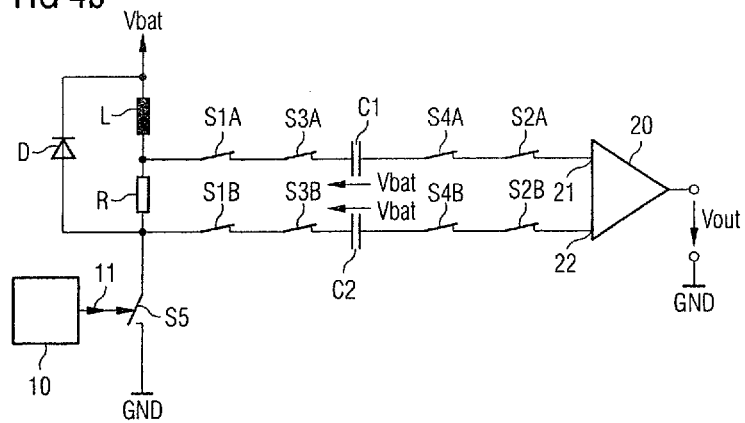

FIG. 4a shows the equivalent circuit diagram of the arrangement illustrated in FIG. 3 for the first operating state, in which the measuring impedance terminals 31, 32 are connected directly to the measuring amplifier 20 via the first and second switching means S1A-S2B. FIG. 4b shows the electrical equivalent circuit diagram for the second operating state, in which the measuring impedance terminals 31, 32 are connected to the terminals 21, 22 of the measuring amplifier 20 by means of the first and second switching means with interposition of the third and fourth switching means and the capacitors C1, C2 charged to the supply voltage Vbat.

The changeover switches illustrated in FIGS. 2 and 3 are preferably driven depending on the pulse-width-modulated signal 11 according to which the load L is connected to the supply voltage Vbat in a pulse-width-modulated manner in order to connect the measuring impedance terminals 31, 32 to the measuring amplifier 20 directly during the first operating state and with interposition of the level shifter 40 during the second operating state.

In an embodiment of a measuring method using the circuit arrangements illustrated in FIGS. 2 and 3, provision is made for connecting the inputs 21, 22 of the measuring amplifier 20 to a reference potential, for example reference-ground potential GND, prior to connection of said inputs 21, 22 to the outputs 43, 44 of the level shifter, in order to provide an autocalibration of the measuring amplifier 20. The numerals "3" specified in brackets beside the changeover switches S1A-S2B in FIG. 3 designate the switching states of said changeover switches during this step. In this case, the measuring impedance terminals 31, 32 are already connected to the inputs of the level shifter 40, but the capacitors C1, C2 still remain connected to the supply voltage Vbat during this calibration step. Additional switches S6A, S6B depicted by broken lines are provided for connection of the input terminals 21, 22 of the measuring amplifier 20.

For driving the switches for taking account of such an autocalibration operation of the measuring amplifier 20, it is possible to use the pulse-width-modulated signal 11 directly for the first and second switching means S1A-S2B. For driving the third and fourth switching means, said pulse-width-modulated signal 11 is to be modified such that the changeover switches of the third and fourth switching means change over only in a time-delayed manner after a falling edge of the pulse-width-modulated signal 11, which can be realized by means of a simple delay circuit (not specifically illustrated). The further switching means S6A, S6B are driven into the on state only for a short time duration after a falling edge of the pulse-width-modulated signal 11. A drive signal that is suitable for driving these further switching means S6A, S6B can likewise be generated in a simple manner using a delay element.

LIST OF REFERENCE SYMBOLS

| | |
|---|---|
| C1, C2 | Capacitors |
| D | Freewheeling diode |
| GND | Reference-ground potential |
| L | Inductive load |
| S1A, S2A | First switching means |
| S1B, S2B | Second switching means |
| S3A, S4A | Third switching means |
| S3B, S4B | Fourth switching means |
| S6A, S6B | Switching means |
| Vbat | Supply voltage, supply potential |
| Vout | Measuring amplifier output signal |
| 10 | Pulse width modulator |
| 11 | Pulse-width-modulated signal |
| 20 | Measuring amplifier |
| 23 | Measuring amplifier output |
| 30 | Measuring impedance |
| 40 | Level shifter |
| 21, 22 | Measuring amplifier inputs |
| 31, 32 | Measuring impedance terminals |
| 41, 42 | Level shifter inputs |
| 43, 44 | Level shifter outputs |
| 45, 46 | Voltage sources |

The invention claimed is:

1. A circuit arrangement for determining the load current through an inductive load connected to a supply voltage in a clocked manner, the arrangement comprising:
   a) a current measuring impedance operable to be connected in series with the inductive load, the current measuring impedance including a first connection and a second connection;
   b) a measuring amplifier including a first amplifier input, a second amplifier input and an amplifier output;
   c) a level shifter including a first level shifter input, a second level shifter input, a first level shifter output and a second level shifter output, the level shifter operable to map a potential present at the first level shifter input onto a potential shifted by a predetermined potential value at the first level shifter output and to map a potential present at the second level shifter input onto a potential shifted by a predetermined potential value at the second level shifter output;
   d) at least one first switch operable to connect the first connection of the current measuring impedance to the first amplifier input, the at least one first switch operable in a first mode to connect the first connection of the current measuring impedance to the first amplifier input and bypass the level shifter, and the at least one first switch operable in a second mode to connect the first connection of the current measuring impedance to the first amplifier input with interposition of the level shifter;
   e) at least one second switch operable to connect the second connection of the current measuring impedance to the second amplifier input, the at least one second switch operable in a first mode to connect the second connection of the current measuring impedance to the first amplifier input and bypass the level shifter, and the at least one second switch operable in a second mode to connect the second connection of the current measuring impedance to the second amplifier input with interposition of the level shifter.

2. The circuit arrangement of claim 1 wherein the at least one first switch comprises two switches.

3. The circuit arrangement of claim 1 wherein the at least one second switch comprises two switches.

4. The circuit arrangement of claim 1 wherein the at least one first switch comprises at least one transistor.

5. The circuit arrangement of claim 1 wherein the at least one second switch comprises at least one transistor.

6. The circuit arrangement of claim 1 in which the level shifter includes a first voltage source connected between the first level shifter input and the first level shifter output.

7. The circuit arrangement of claim 6 wherein the level shifter includes a second voltage source connected between the second level shifter input and the second level shifter output.

8. The circuit arrangement of claim 1 wherein the level shifter further comprises
   a) a first capacitive storage element and a second capacitive storage element,
   b) a third switch operable in a first mode to connect the first capacitive storage element to a supply voltage and operable in a second mode to connect the first capacitive storage element between the first level shifter input and the first level shifter output, and
   c) a fourth switch operable in a first mode to connect the second capacitive storage element to the supply voltage and operable in a second mode to connect the second capacitive storage element between the second level shifter input and the second level shifter output.

9. A method of determining a load current through an inductive load connected to a supply voltage in a clocked manner, the method comprising:
   a) providing a current measuring impedance connected in series with the inductive load, the current measuring impedance including a first connection and a second connection;
   b) connecting the first connection of the measuring impedance to a first amplifier input and connecting the second connection of the measuring impedance to a second amplifier input when the load is connected to the supply voltage;

c) connecting the first connection of the measuring impedance to a first amplifier input with a level shifter between the first connection and the first amplifier input and connecting the second connection of the measuring impedance to the second amplifier input with the level shifter between the second connection and the second amplifier input when the load is isolated from the supply voltage.

10. The method of claim 9 further comprising the step of connecting the first amplifier input and the second amplifier input to a reference ground potential prior to connection of the first amplifier input and second amplifier input to the level shifter.

11. The method of claim 9 wherein the value of the supply voltage applied to the load corresponds to the value of a predetermined potential by which the level shifter shifts potentials at a first level shifter input and a second level shifter input.

12. The method of claim 9 wherein level shifter comprises a first level shifter input, a first level shifter output, and a first voltage source connected between the first level shifter input and the first level shifter output.

13. The method of claim 12 wherein level shifter comprises a second level shifter input, a second level shifter output, and a second voltage source connected between the second level shifter input and the second level shifter output.

14. The method of claim 13 wherein the level shifter further comprises a first capacitive storage element and a second capacitive storage element.

15. The method of claim 14 further comprising the steps of d) connecting the first capacitive storage element and the second capacitive storage element to the supply voltage when the load is connected to the supply voltage; and e) connecting the first capacitive storage element between the first level shifter input and the first level shifter output and connecting the second capacitive storage element between the second level shifter input and the second level shifter output when the load is isolated from the supply voltage.

16. The method of claim 9 wherein the first connection of the measuring impedance is directly connected to the first amplifier input and the second connection of the measuring impedance is directly connected to the second amplifier input when the load is connected to the supply voltage.

17. A circuit for determining the load current through an inductive load connected to a supply voltage, the circuit comprising:

a) a measuring impedance connected to the inductive load, wherein a measurement voltage is defined across the measuring impedance;

b) a measuring amplifier;

c) means for influencing a DC voltage offset of the measurement voltage;

d) means for connecting the measuring impedance to the measuring amplifier, the means for connecting operable to bypass the means for influencing when the load is connected to the supply voltage and operable to interpose the means for influencing between the measuring impedance and the measuring amplifier when the load is isolated from the supply voltage.

18. The circuit of claim 17 wherein the means for influencing comprises a plurality of transistors.

19. The circuit of claim 17 wherein the means for influencing comprises at least one capacitive storage element and at least one switch, wherein the at least one switch is operable in a first mode to connect the at least one capacitive storage element to a supply voltage and operable in a second mode to connect the at least one capacitive storage element between the measuring impedance and the measuring amplifier.

* * * * *